United States Patent
Malinge et al.

(10) Patent No.: US 11,102,429 B2
(45) Date of Patent: Aug. 24, 2021

(54) INTEGRATED GLOBAL SHUTTER IMAGE SENSOR

(71) Applicant: STMicroelectronics (Crolles 2) SAS, Crolles (FR)

(72) Inventors: Pierre Malinge, Bernin (FR); Frédéric Lalanne, Bernin (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 77 days.

(21) Appl. No.: 16/547,369

(22) Filed: Aug. 21, 2019

(65) Prior Publication Data

US 2020/0068148 A1    Feb. 27, 2020

(30) Foreign Application Priority Data

Aug. 23, 2018 (FR) ..................... 1857618

(51) Int. Cl.
*H04N 5/355* (2011.01)
*H04N 5/3745* (2011.01)
*H01L 27/146* (2006.01)

(52) U.S. Cl.
CPC ....... *H04N 5/3559* (2013.01); *H01L 27/1463* (2013.01); *H04N 5/37452* (2013.01); *H04N 5/37457* (2013.01)

(58) Field of Classification Search
None
See application file for complete search history.

(56) References Cited

U.S. PATENT DOCUMENTS

| 2005/0023635 | A1 | 2/2005 | Mouli et al. |
| 2007/0132869 | A1 | 6/2007 | Genilloud et al. |
| 2010/0188544 | A1* | 7/2010 | Shizukuishi ...... H01L 27/14609 348/308 |
| 2010/0290028 | A1* | 11/2010 | Tachino ........... H01L 27/14612 356/5.01 |
| 2014/0077062 | A1 | 3/2014 | Hynecek |
| 2014/0320685 | A1 | 10/2014 | Takenaka et al. |

(Continued)

FOREIGN PATENT DOCUMENTS

| CN | 1735969 A | 2/2006 |
| CN | 1984230 A | 6/2007 |

(Continued)

*Primary Examiner* — Cynthia Segura
(74) *Attorney, Agent, or Firm* — Slater Matsil, LLP (57) ABSTRACT

In one embodiment, an integrated image sensor includes an array of pixels in which each pixel includes a photosensitive area configured to integrate a luminous signal by generating electron-hole pairs so as to form a first signal representative of the number of electrons in the generated electron-hole pairs and a second signal representative of the number of holes in the generated electron-hole pairs. A first circuit portion is configured to store the first signal sheltered from light. A second circuit portion is configured to store the second signal sheltered from light. A third circuit portion is configured to read the first signal and the second signal and able to perform combination operations between the first signal and the second signal so as to generate a combined signal representative of an image, where the integrated image sensor is tailored to operate in a global shutter control mode.

18 Claims, 6 Drawing Sheets

(56) References Cited

U.S. PATENT DOCUMENTS

| | | | |
|---|---|---|---|
| 2015/0035028 A1 | 2/2015 | Fan et al. | |
| 2016/0118438 A1 | 4/2016 | Leung et al. | |
| 2017/0040361 A1 | 2/2017 | Ikeda et al. | |
| 2017/0170227 A1* | 6/2017 | Wada | H01L 27/14643 |
| 2017/0186806 A1 | 6/2017 | Lalanne et al. | |
| 2017/0263686 A1 | 9/2017 | Beiley et al. | |
| 2017/0350756 A1* | 12/2017 | Panicacci | G01J 1/4228 |
| 2018/0027193 A1 | 1/2018 | Bock et al. | |
| 2020/0043968 A1* | 2/2020 | Hynecek | H01L 27/1461 |
| 2020/0068148 A1 | 2/2020 | Malinge et al. | |

FOREIGN PATENT DOCUMENTS

| | | |
|---|---|---|
| CN | 105552094 A | 5/2016 |
| CN | 106449669 A | 2/2017 |
| CN | 211406121 U | 9/2020 |
| WO | 2004044989 A1 | 5/2004 |
| WO | 2018075705 A1 | 4/2018 |

* cited by examiner

INTEGRATED GLOBAL SHUTTER IMAGE SENSOR

CROSS-REFERENCE TO RELATED APPLICATIONS

This application claims priority to French Patent Application No. 1857618, filed on Aug. 23, 2018, which application is hereby incorporated herein by reference.

TECHNICAL FIELD

This application relates to integrated circuits, and more particularly to integrated global shutter image sensor.

BACKGROUND

Conventional image sensors use a rolling shutter and, when an image is captured, the exposure of the pixels of the array and the transfer of the charges of each row of the array start and stop at separate successive instants, with the possibility for example of the transfer of the charges of the first row of the array and the exposure of the pixels of the last row of the array overlapping in time.

The lack of simultaneity of the exposures of the pixels may lead to deformations in the image that is obtained, in particular when the scene that is captured includes elements that are moving quickly.

Some image sensors, called global shutter image sensors, allow simultaneous exposure of all of the pixels of the array, even though the charges of the pixels are transferred row by row, and do so by virtue of the presence of an additional storage node in each pixel, making it possible to retain the charge representative of the illumination and therefore to delay the transfer thereof.

High dynamic range (or HDR, using the acronym well known to those skilled in the art) imagers allow the capturing of images including a wide range of luminous intensities, without saturation. To obtain such an image, it is necessary to combine two signals representative of a scene. Conventionally, use is made of two signals from two separate illuminations of the pixels.

There are various methods for obtaining high dynamic range images, all of which are expensive and difficult to implement.

There is therefore a need to produce, in a simple manner, a global shutter sensor that makes it possible to obtain high dynamic range images.

SUMMARY

Thus, according to one embodiment, what is proposed is a global shutter imager device that makes it possible to obtain high dynamic range images.

According to one aspect, what is proposed is an integrated image sensor tailored to a control mode called global shutter control mode, including an array of pixels in which each pixel includes a photosensitive area able to integrate a luminous signal by generating electron-hole pairs so as to form a first signal representative of the number of electrons and a second signal representative of the number of holes, a first circuit portion able to store the first signal sheltered from light, a second circuit portion able to store the second signal sheltered from light, and a third circuit portion able to read the first signal and the second signal and able to perform combination operations between the first signal and the second signal so as to generate a combined signal, the set of the combined signals being intended to form an image.

Thus, rather than performing two illuminations so as to obtain two signals to be combined, use is advantageously made of the second signal representative of the number of holes so as to combine it with the first signal.

Furthermore, storing the second signal sheltered from light advantageously makes the image sensor tailored to a global shutter control mode.

The third portion may be configured to code each first signal and each second signal on a first number of bits, and to code each combined signal on a second number of bits greater than the first number of bits.

Thus, the image sensor advantageously makes it possible to obtain a high dynamic range image.

Each second circuit portion may include a hole storage area that is electrically isolated from the photosensitive area and able to receive the second signal through a capacitive effect, and the third portion being able to receive said second signal through a capacitive effect, the third circuit portion including a read node and processing circuit that are configured to read, code and combine the first signal and the second signal.

According to one embodiment, the array is produced in a semiconductor substrate and each pixel is produced in a well and completely surrounded by a respective and separate capacitive isolation trench including a semiconductor filling material and lined with an insulating material.

In other words, each trench is specific to each pixel (without sharing with another pixel).

According to one embodiment, the second circuit portion of each pixel includes a first capacitor connected to the photosensitive area and formed by the well, the insulating material and the filling material that forms the hole storage area, a second capacitor connected between the first capacitor and a reference supply terminal, for example ground, and formed by the filling material, the insulating material and a portion of the substrate external to the pixel, and a third capacitor coupled between the second portion and the read node. The sensor furthermore including control circuit able to reset the electrical potentials of the photosensitive area, of the hole storage area and of the read node to reference values.

The third capacitor may be coupled between the well and the read node, or between the filling material and the read node.

According to one aspect, what is proposed is a method for obtaining an image using an image sensor tailored to a capture mode called global shutter capture mode, including an array of pixels able to generate electron-hole pairs in response to an illumination, wherein the photosensitive areas of the pixels are illuminated and, for each pixel, a first signal representative of the number of electrons generated during the illumination is stored in a storage node sheltered from light, a second signal representative of the number of holes generated during the illumination is stored in a hole storage area sheltered from light, the first signal is transferred to a read node and the first signal is read, the second signal is transferred to the read node and the second signal is read, the first signal and the second signal are combined, the set of the combined signals forming said image.

It is possible to code the first signal and the second signal on a first number of bits, and combine the first signal and the second signal so as to obtain a combined signal coded on a second number of bits greater than the first number of bits.

According to one embodiment, the second signal is transferred into the hole storage area through a capacitive effect on the basis of the potential variation induced by the generation of the holes in the photosensitive area, and the second signal is transferred from the hole storage area to the read node through a capacitive effect.

BRIEF DESCRIPTION OF THE DRAWINGS

Other advantages and features of the invention will become apparent upon examining the detailed description of wholly nonlimiting modes of implementation and embodiments of the invention and the appended drawings, in which.

DETAILED DESCRIPTION OF ILLUSTRATIVE EMBODIMENTS

Modes of implementation and embodiments of the invention relate to integrated circuits, and more particularly to imager integrated circuits including an array of pixels that is associated with charge transfer circuits.

Figure 1:
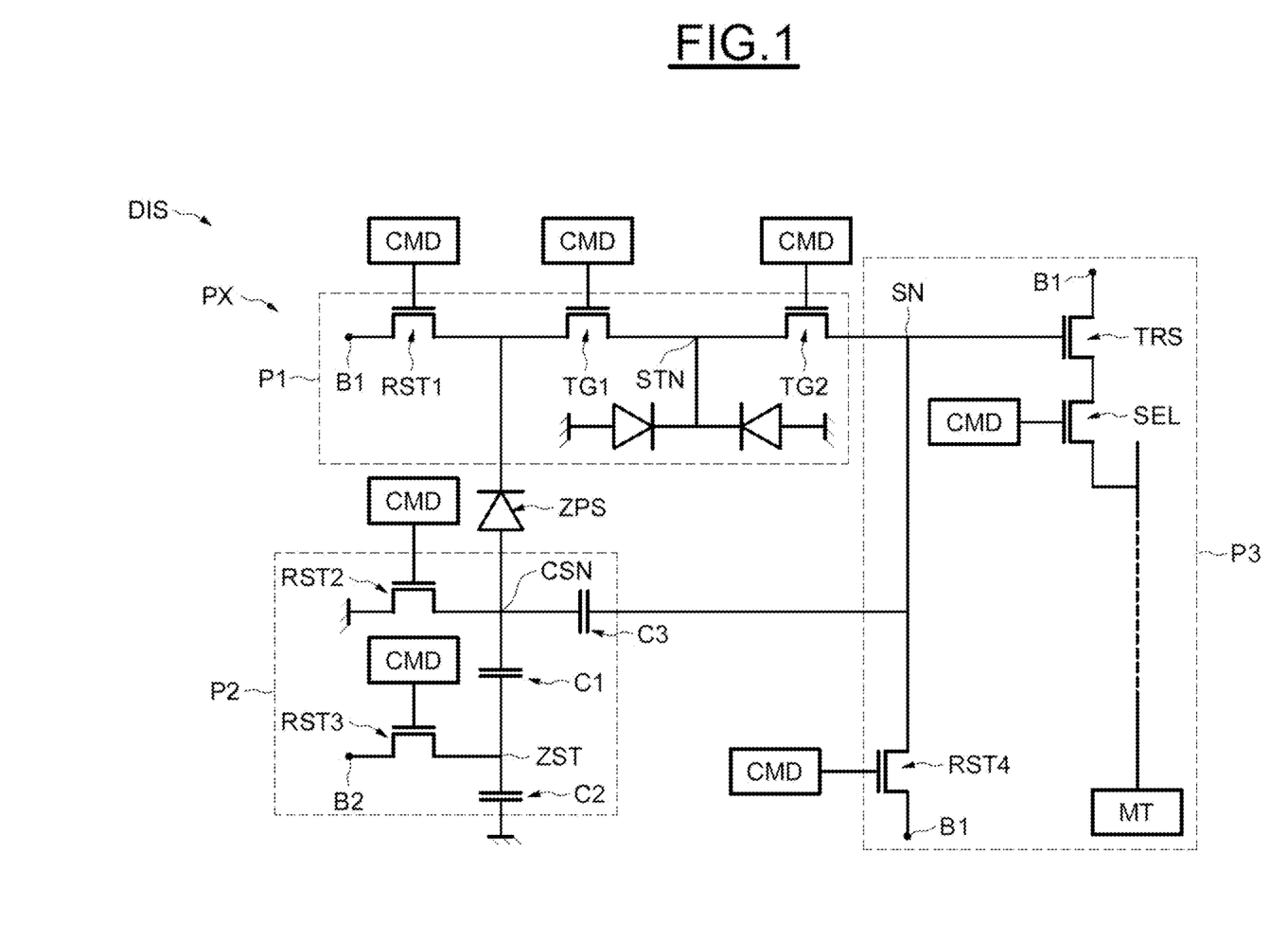
FIGS. 1 to 8 illustrate modes of implementation and embodiments of the invention.

In FIG. 1, the reference DIS denotes an integrated image sensor tailored to a global shutter control mode and that advantageously makes it possible to produce high dynamic range images.

The image sensor DIS includes an array of pixels and, since each pixel of the array has an identical structure, just one pixel PX will be described and illustrated here and in the remainder of the description. FIG. 1 is a schematic illustration thereof in the form of a circuit diagram.

The pixel PX includes a photosensitive area ZPS, here a photodiode able to integrate a luminous signal by generating electron-hole pairs so as to form a first signal representative of the number of electrons and a second signal representative of the number of holes, a first circuit portion P1 configured to receive and store the first signal sheltered from light, a second circuit portion P2 configured to receive and store the second signal sheltered from light, and a third circuit portion P3 configured to read and transfer the first signal and the second signal to a processing circuit MT common to all of the pixels of the column of the array of the sensor DIS.

The anode of the photodiode ZPS is formed here by a semiconductor well CSN, as will be seen in further detail in the remainder of the description.

The first portion P1 includes a first initialization transistor RST1, here an NMOS transistor, coupled between the cathode of the photodiode ZPS and a first supply terminal B1 able to deliver a first voltage, for example here a voltage of 2.5 volts.

The first initialization transistor RST1 has its gate coupled to control circuit CMD that is able to put the transistor into an off state or into an on state, as will be seen hereinafter.

Putting the first initialization transistor RST1 into the on state makes it possible to initialize the potential of the cathode of the photodiode ZPS at the first voltage, here 2.5 volts.

The first initialization transistor RST1 also performs an anti-blooming function, and is configured to evacuate the excess of electrons stored in the photodiode ZPS to the first terminal B1, so as to avoid them migrating to other pixels of the sensor DIS.

A first transfer transistor TG1 and a second transfer transistor TG2, here two NMOS transistors, are coupled in series between the cathode of the photodiode ZPS and a read node SN of the third portion P3 of the pixel PX. The gate of the first transfer transistor TG1 and the gate of the second transfer transistor TG2 are coupled to the control circuit CMD.

The electrode common to the first transfer transistor TG1 and to the second transfer transistor TG2 is coupled here to an electron storage node STN, represented here by two diodes whose cathodes are coupled to one another and whose anodes are coupled to ground.

Putting the first transfer transistor TG1 into the on state makes it possible to transfer the electrons accumulated at the anode of the photodiode ZPS to the storage node STN, and putting the second transfer transistor into the on state makes it possible to transfer the charges stored in the storage node to the read node SN.

The second portion P2 includes a first capacitor C1 and a second capacitor C2 that are coupled in series between the anode CSN of the photodiode ZPS and ground.

A second initialization transistor RST2, here an NMOS transistor, is coupled between ground and the anode CSN of the photodiode ZPS, and a third initialization transistor RST3, here an NMOS transistor, is coupled between a second supply terminal B2 configured to deliver a second supply voltage, here a negative voltage, for example a voltage of −1 volt, and the electrode common to the first capacitor and to the second capacitor, which forms a hole storage area ZST, as will be seen hereinafter.

The second initialization transistor RST2 and the third initialization transistor RST3 have their gates coupled to the control circuit CMD. Putting the second initialization transistor RST2 into the on state makes it possible to ground the cathode of the photodiode ZPS, and putting the third initialization transistor RST3 into the on state makes it possible to initialize the hole storage node ZST at the second supply voltage.

A third capacitor C3 is coupled here between the anode of the photodiode ZPS and the read node SN of the third portion P3.

The third portion P3 includes a fourth initialization transistor RST4, here an NMOS transistor, coupled between the read node SN and the first supply terminal B1. The gate of the fourth initialization transistor RST4 is coupled to the control circuit CMD, and putting the fourth initialization transistor RST4 into the on state makes it possible to initialize the potential of the read node SN at the first voltage.

A follower transistor TRS and a selection transistor SEL, here two NMOS transistors, are coupled in series between the first terminal B1 and processing circuit MT.

The selection transistor SEL has its gate coupled to the control circuit CMD, and the control circuit CMD are configured to put the selection transistor SEL into the on state when it is necessary to transfer the charges of the pixel PX to the processing circuit, that is to say when the row of the array comprising the pixel PX is selected by the control circuit CMD.

It should be noted here that the first circuit portion P1 and the third circuit portion P3 have structures that are conventional and known per se in the field of global shutter imagers.

Their structures are thus not limited to those described and illustrated in the figures, and those skilled in the art will know how to tailor the first and third portions P1 and P3 depending on the application under consideration.

Figure 2:
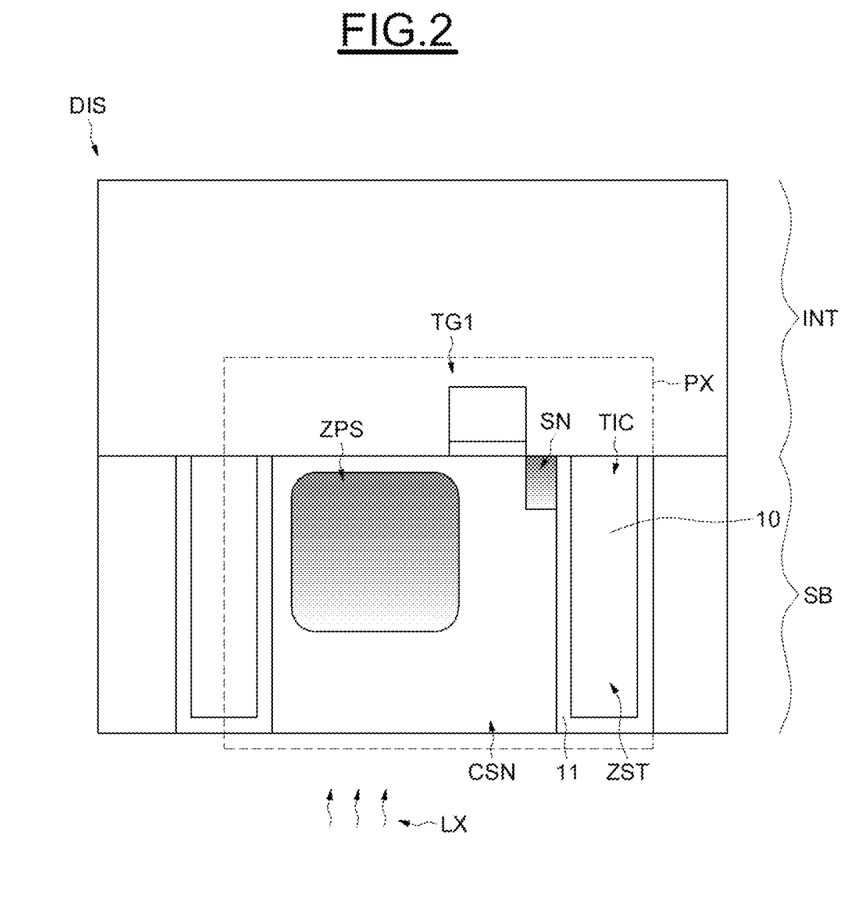
Figure 3:
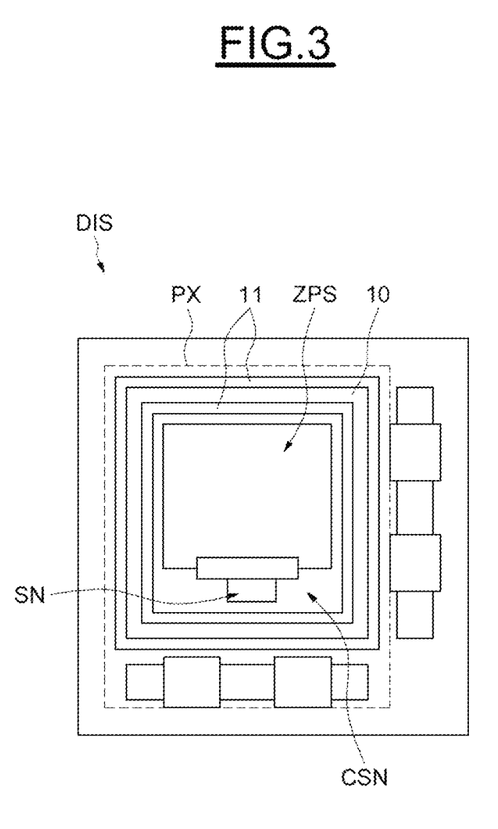

FIG. 2 is a schematic and partial structural depiction of the pixel PX, and FIG. 3 is a plan view of FIG. 2.

The image sensor DIS is produced in and on a semiconductor substrate SB that is surmounted by an interconnect portion INT that conventionally includes metal tracks and vias for interconnecting the various electronic components of the image sensor DIS.

The image sensor DIS here is a back-face illumination image sensor, and it is therefore configured to receive said illumination LX, or luminous signal, on the back face of its substrate SB, that is to say here that face of the substrate SB furthest from the interconnect portion INT.

The pixel PX includes the semiconductor well CSN mentioned above, which is p-doped here, delimited from the rest of the substrate SB by a capacitive isolation trench TIC completely surrounding the well CSN so as to delimit the edges thereof. This capacitive isolation trench TIC is exclusive to each pixel of the array, and is therefore not common to a plurality of pixels.

The capacitive isolation trench TIC conventionally includes a semiconductor filling material 1o, here polysilicon, and is lined with an insulating material 11, here silicon oxide.

The filling material to of the capacitive isolation trench TIC here forms the hole storage area ZST. The hole storage area ZST and the storage node STN are protected here from the illumination LX. In particular, the storage node STN is protected from the illumination LX by a metal screen (not shown), typically made of tungsten or of aluminium and positioned on the back face.

The pixel PX conventionally includes a photosensitive area, here the photodiode ZPS produced in the centre of the well CSN through implantation of an n-type dopant product; the cathode of the photodiode is thus formed by the n-doped area, and the anode of the photodiode ZPS is formed by the rest of the well CSN, which is p-doped. The photodiode ZPS here is a pinned photodiode.

The storage node STN is produced at the periphery of the pixel PX through implantation of the n-type dopant product. A first transfer gate is produced on the pixel PX, between the photosensitive area ZPS and the storage node. The cathode of the photodiode ZPS, the transfer gate and the storage node SN thus form the first transfer transistor TG1.

The first capacitor C1 is formed here by the well CSN that forms a first electrode of the capacitor C1, by a portion of the insulating material 11 of the capacitive trench TIC in contact with the well CSN and that forms the dielectric of the capacitor C1, and by the filling material to that forms a second electrode of the first capacitor C1.

The second capacitor C2 is formed here by the filling material to of the capacitive trench TIC that forms a first electrode of the second capacitor C2, by a portion of the insulating material in contact with that portion of the substrate SB external to the well CSN and that forms the dielectric of the second capacitor C2, and by that portion of the substrate SB external to the well and adjacent to the pixel PX that forms a second electrode of the second capacitor C2.

The third capacitor C3 is produced here in the interconnect portion, and includes for example two electrodes formed by metal tracks that are produced facing one another in separate metallization levels, the dielectric of the third capacitor C3 being formed by the intermetal dielectric of the interconnect portion INT.

For the sake of simplicity, the other components of the pixel PX that are visible in FIG. 1 have not been shown in FIGS. 2 and 3.

Figure 4:
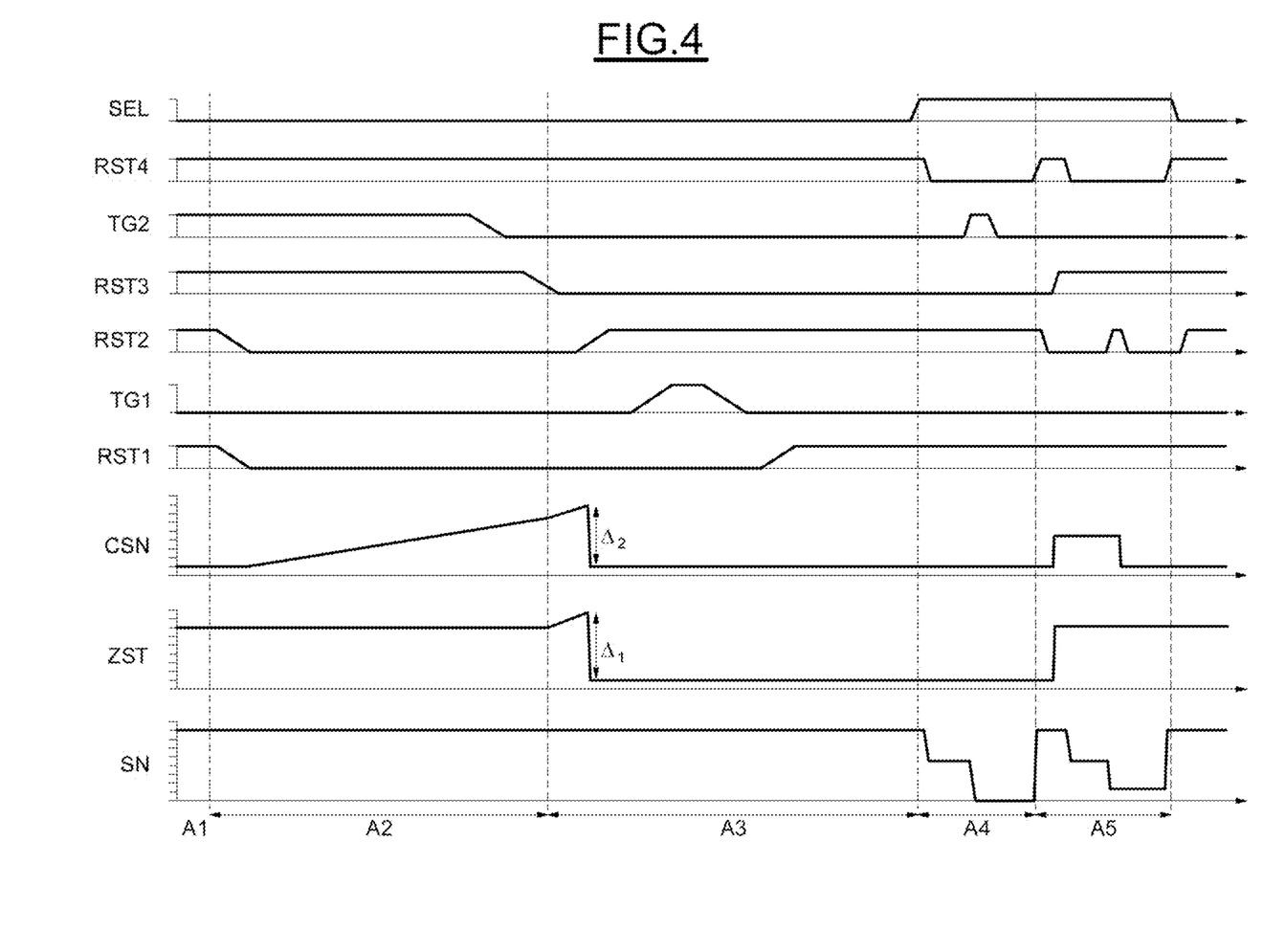

The remainder of the description relates to one mode of implementation of the image sensor DIS, illustrated by FIG. 4, which is a timing diagram representative of the states of the signals sent by the control circuit CMD to the gates of the various transistors.

In a first step A1, which forms the initial state of the pixel PX prior to illumination, the control circuit CMD puts the first initialization transistor RST1, the second initialization transistor RST2, the third initialization transistor RST3 and the fourth initialization transistor RST4 into the on state. The transfer transistors TG1 and TG2 as well as the selection transistor SEL are in the off state.

The cathode of the photodiode is thus initialized at the first voltage, typically a high voltage, for example 2.5 volts. The well CSN is initialized at ground, the hole storage area ZST is initialized at the second voltage, here −1 volt, and the read node SN is initialized at the first voltage, 2.5 volts.

In a second step A2, the control circuit CMD puts the first initialization transistor RST1 and the second initialization transistor RST2 into the off state, and the photodiode is exposed to the illumination LX. Electron-hole pairs are generated in the photodiode ZPS in response to said illumination LX. The electrons accumulate in the cathode of the photodiode, that is to say the n-doped area, thus forming the first signal and thus reducing the value of its electrical potential, whereas the holes migrate to the well CSN, that is to say accumulate at the first electrode of the first capacitor C1, thus forming the second signal and thus increasing the value of its electrical potential, for example to 1.8 volts.

If the electron storage capacity of the photodiode ZPS saturates, said electrons are evacuated to the first terminal B1 via the first initialization transistor RST1. Specifically, even if the initialization transistor is in the off state, the potential difference between its two electrodes is enough to generate a leakage current that allows the electrons to be evacuated.

Thus, in this case, the number of electrons in the photodiode no longer increases. By way of indication, the photodiode ZPS has a storage capacity of the order of ten thousand to twenty thousand electrons.

Even if the photodiode ZPS saturates, the generation of new electrons (which will then be evacuated) is associated with the generation of new holes, which will accumulate in the well CSN. The number of holes stored in the well CSN may therefore be greater than the number of electrons stored in the photodiode ZPS.

By way of indication, the well CSN has a storage capacity of the order of ten thousand to one million holes.

In a third step A3, the control circuit CMD puts the second initialization transistor RST2 into the on state and the third initialization transistor RST3 into the off state.

The well CSN is therefore coupled to ground and the hole storage area ZST is therefore floating.

The control circuit CMD also puts the second transfer transistor TG2 into the off state.

The holes are therefore evacuated to ground, and the potential in the hole storage area ZST varies proportionally to the voltage variation of the well CSN. The second signal has thus been transferred through a capacitive effect from the well CSN to the hole storage area ZST.

More precisely, said potential variation in the hole storage area ZST depends on the capacitive ratio between the first capacitor C1 and the second capacitor C2.

By way of indication, the value of the potential variation in the hole storage area ZST is acquired using the formula $$\Delta_1 = \Delta_2 \times \frac{F1}{F1 + F2}$$

Where Δ1 is the potential variation in the hole storage area ZST, Δ2 is the potential variation of the well CSN, F1 is the capacitance of the first capacitor C1 and F2 is the capacitance of the second capacitor C2.

Thus, if the two capacitors C1 and C2 have identical values, the gain that is obtained will be 0.5. Plus, since the potential variation Δ2 in the well CSN is 1.8 volts, the corresponding potential variation Δ1 in the hole storage area ZST is 0.9 volts.

The information representative of the number of holes accumulated in the well CSN, or first signal, has therefore been transferred from the well CSN to the hole storage area ZST.

As this hole storage area ZST is protected from light, new charges are not able to modify the potential in the hole storage area ZST. Said information is therefore preserved.

The control circuit CMD then puts the first transfer transistor TG1 into the on state for a brief duration long enough to transfer the electrons accumulated in the photodiode ZPS to the electron storage node STN, and then puts the first initialization transistor RST1 into the on state so as to reset the potential of the cathode of the photodiode to the first voltage, here 2 volts. The first signal has therefore been transferred here from the photosensitive area ZPS to the electron storage node.

In a fourth step A4, the electrons, that is to say the first signal, are transferred, in a manner that is conventional and known per se, using the correlated double sampling (CDS in acronym form) method.

In this method, prior to the transfer of the electrons, the control circuit CMD puts the fourth transistor RST4 into an off state, and the read node SN, initialized at 2.5 volts, therefore becomes floating.

The control circuit CMD also puts the selection transistor SEL into the on state, so as to perform a first reading of the potential present on the read node SN using the processing circuit MT.

The electrons present on the storage node STN are then transferred to the read node SN. To this end, the control circuit CMD briefly puts the second transfer transistor TG2 into the on state. The value of the potential of the read node SN therefore decreases.

A second reading of the potential present on the read node SN is then performed by the processing circuit MT, and the processing circuit MT subtracts the value read in the second reading from the value read in the first reading, so as to obtain a first digital signal representative of the number of electrons generated by the illumination LX.

In a fifth step A5, the control circuit briefly puts the fourth transistor RST4 into the on state so as to reset the value of the read node SN to the first voltage.

A new first reading is then performed so as to read the potential of the read node SN.

The control circuit CMD then puts the second transistor RST2 into the off state, and the well CSN is therefore floating, and put the third transistor RST3 into the on state, and the hole storage area ZST is therefore at the second voltage, here −1 volt.

The potential of the well CSN thus increases again proportionally to the potential rise in the hole storage area, changing for example from 0 volts to 0.9 volts.

The control circuit CMD then puts the fourth transistor RST4 into an off state so as to make the read node SN float, and briefly puts the second transistor RST2 into the on state so as to couple the well CSN to ground. The potential of the well therefore changes from 0.9 volts to 0 volts.

This drop in the value of the potential of the well CSN leads to a proportional drop in the value of the potential of the read node SN, via the third capacitor C3.

A new second reading of the potential of the read node SN is then performed, and the processing circuit MT subtracts the value read in the new second reading from the value read in the new first reading, so as to obtain a second digital signal representative of the number of holes generated by the illumination LX.

The processing circuit are therefore then able to obtain a high dynamic range image using operations of combining the first signal and the second signal. In particular, the processing circuit MT are configured to code the first and second digital signals on a first number of bits and to obtain a combined signal coded on a second number of bits greater than the first number of bits.

Carrying out an imaging operation using the steps described above is advantageous as it makes it possible to obtain two signals from a single illumination, on the one hand, and it also makes it possible to use the same processing circuit MT to obtain the two signals representative of the illumination, the first digital signal and the second digital signal both being obtained through an operation of subtracting the value read in the second reading from the value read in the first reading.

Figure 5:
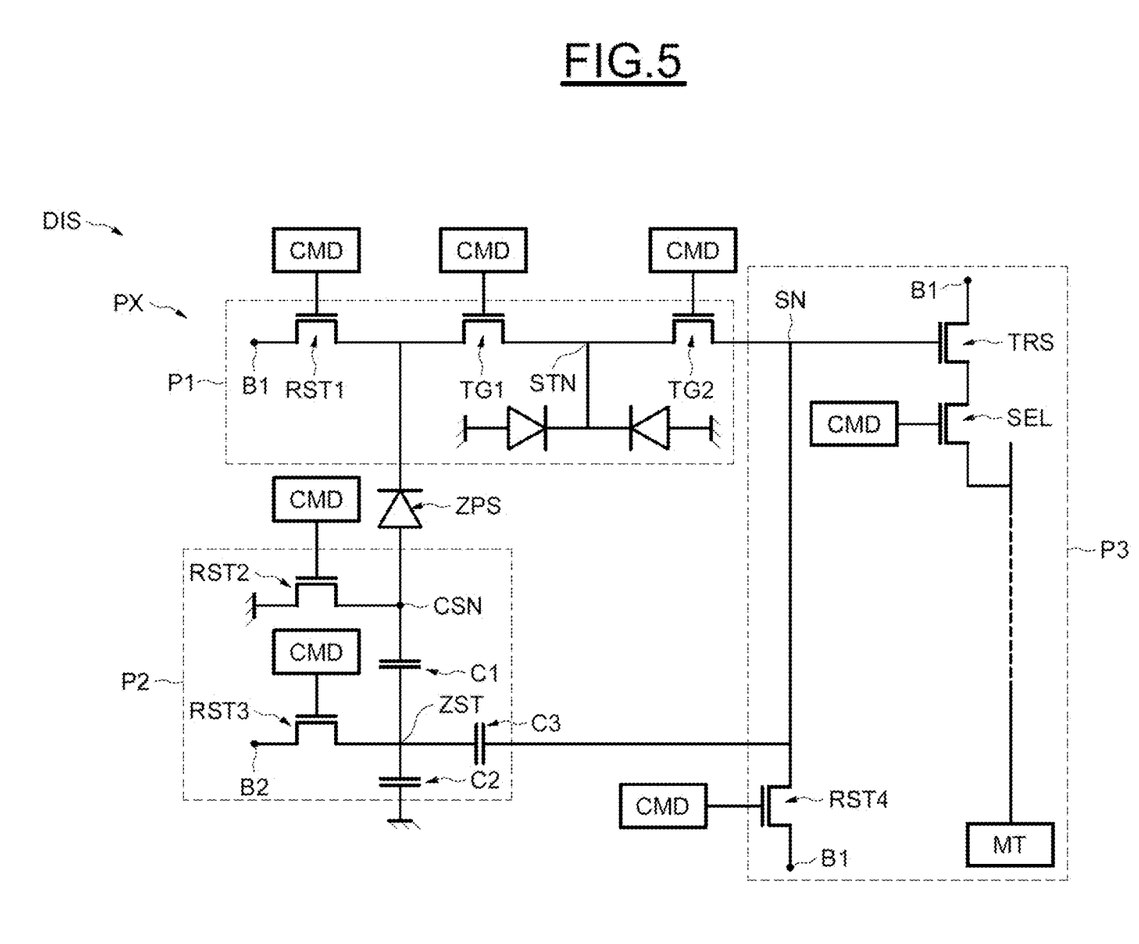

It would be possible, however, as illustrated in FIG. 5, for the third capacitor C3 not to be coupled between the read node and the well CSN, but between the read node SN and the hole storage area ZST.

In this case, in the fifth step A5, after the new first reading, the control circuit CMD put the fourth transistor RST4 into the off state, and then put the third transistor RST3 into the on state.

The rise in the potential in the hole storage area ZST leads to a proportional rise on the read node SN.

The new second reading is then performed, and the processing circuit subtract the value read in the first reading from the value read in the second reading.

In other words, there is an increase in the value of the potential of the read node SN between the new first reading and the new second reading. It is therefore necessary here to have processing circuit MT that are configured to subtract the value of the second reading from the value of the first reading in the fourth step, and that are configured to subtract the value of the first reading from that of the second reading in the fifth step A5.

Although it requires a more complex configuration of the processing circuit MT, this embodiment of the device DIS also makes it possible to obtain high dynamic range images using just one and the same illumination.

Figure 6:
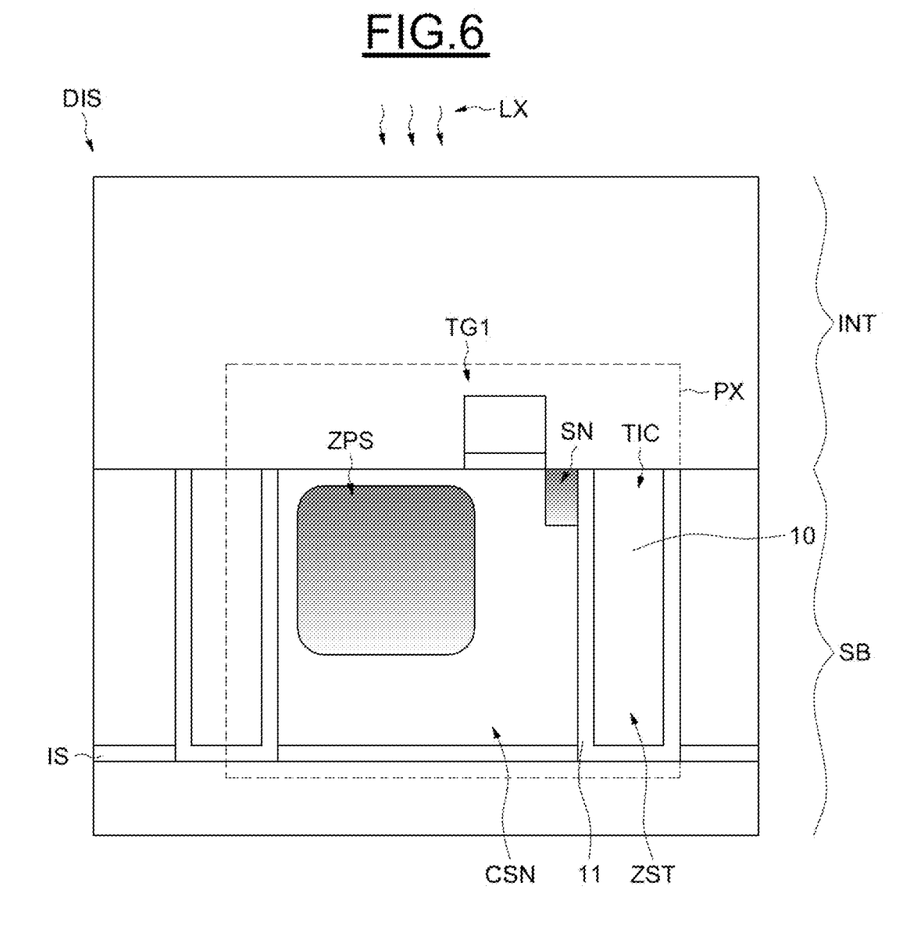

As illustrated in FIG. 6, the imager device DIS may have front-face illumination. In this case, that region of the interconnect portion INT situated above and facing the well CSN and the photosensitive area ZPS does not have a metal line, and the well CSN is isolated from the rest of the substrate SB by the capacitive isolation trench TIC that delimits the edges of the well and by a buried insulating layer IS that delimits the bottom of the well.

Figure 7:
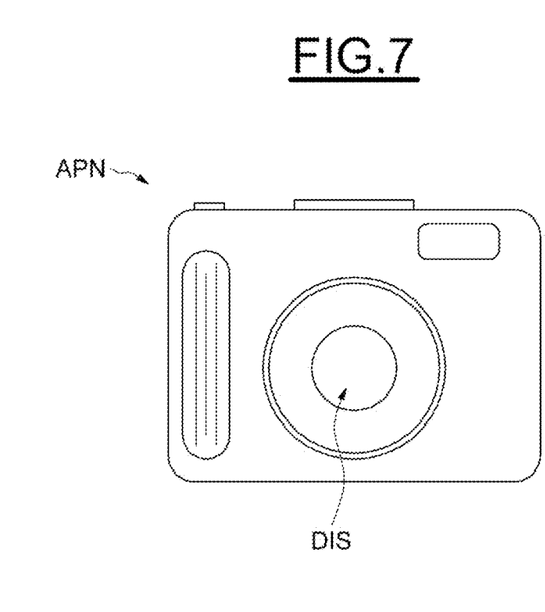
Figure 8:
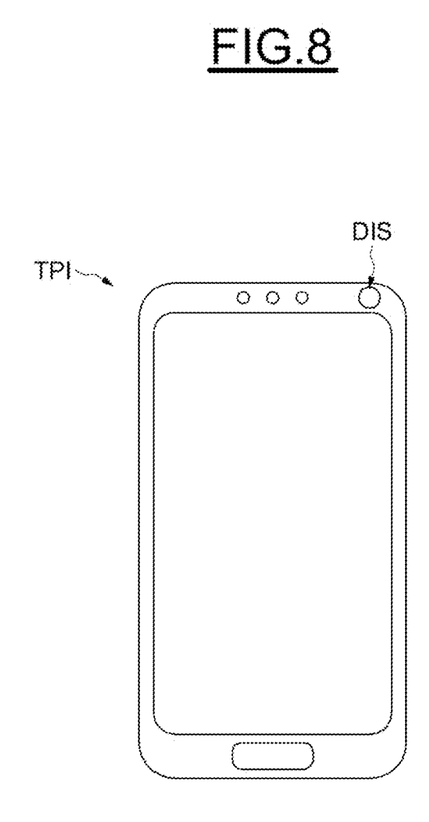

The imager device DIS illustrated above with reference to FIGS. 1 to 6 may be integrated into various types of system including image sensors, such as a digital camera APN as illustrated in FIG. 7, or a mobile smartphone TPI such as the one illustrated in FIG. 8.

Moreover, the invention is not limited to these embodiments and modes of implementation, but incorporates all variants thereof, in particular, the various voltage values and potential values have been given by way of wholly nonlimiting example.

What is claimed is:

1. An integrated image sensor comprising an array of pixels in which each pixel comprises:
    a photosensitive area configured to integrate a luminous signal by generating electron-hole pairs so as to form a first signal representative of the number of electrons in the generated electron-hole pairs and a second signal representative of the number of holes in the generated electron-hole pairs;
    a first circuit portion configured to store the first signal sheltered from light;
    a second circuit portion configured to store the second signal sheltered from light, wherein the array is disposed in a semiconductor substrate and each pixel is disposed in a well and completely surrounded by a respective and separate capacitive isolation trench, the capacitive isolation trench being lined with an insulating material and filled with a semiconductor filling material, wherein the second circuit portion includes a hole storage area formed in the semiconductor filling material, a first capacitor connected to the photosensitive area and formed by the well, the insulating material and the semiconductor filling material, and a second capacitor connected between the first capacitor and a reference supply terminal and formed by the semiconductor filling material, the insulating material and a portion of the substrate external to the pixel; and
    a third circuit portion configured to read the first signal and the second signal and able to perform combination operations between the first signal and the second signal so as to generate a combined signal representative of an image, wherein the integrated image sensor is tailored to operate in a global shutter control mode.

2. The sensor according to claim 1, wherein the third circuit portion is configured to code each first signal and each second signal on a first number of bits, and to code each combined signal on a second number of bits greater than the first number of bits.

3. The sensor according to claim 1, wherein the second circuit portion includes a hole storage area that is electrically isolated from the photosensitive area and configured to receive the second signal through a capacitive effect, and the third circuit portion being configured to receive the second signal through a capacitive effect, the third circuit portion including a read node and processing circuit that are configured to read, code and combine the first signal and the second signal.

4. The sensor according to 3, wherein the second circuit portion includes:
    a third capacitor coupled between the second circuit portion and the read node; and
    the sensor furthermore including a control circuit configured to reset electrical potentials of the photosensitive area, of the hole storage area and of the read node to reference values.

5. The sensor according to 4, wherein the third capacitor is coupled between the well and the read node.

6. The sensor according to 4, wherein the third capacitor is coupled between the filling material and the read node.

7. A global shutter image sensor comprising:
    a photodiode disposed in a well region of a semiconductor substrate, the photodiode configured to generate electron-hole pairs when exposed to an illumination;
    a trench surrounding the well region;
    an electron storage area disposed in the well region to store the electrons generated at the photodiode during the illumination;
    a transfer gate configured to transfer the electrons generated at the photodiode to the electron storage area;
    a hole storage area disposed within the trench and configured to store the holes generated at the photodiode during the illumination;
    a first capacitor coupled between the well region and the hole storage area;
    a second capacitor coupled between the hole storage area and a first reference potential node, wherein the second capacitor is coupled to the well region through the first capacitor; and
    read node coupled to the electron storage area and the hole storage area, wherein the sensor comprises an array of pixels in which each pixel in the array comprises a corresponding one of the photodiode, the trench, the electron storage area, the transfer gate, the hole storage area, the first capacitor, the second capacitor, and the read node.

8. The sensor according to claim 7, wherein each pixel in the array of pixels further comprises:
    a first transistor coupled between the first reference potential node and the well region; and
    a second transistor coupled between the hole storage area and a second reference potential node.

9. The sensor according to claim 7, wherein each pixel in the array of pixels further comprises:
    a third capacitor coupled between the well region and a read node.

10. The sensor according to claim 7, wherein the trench is lined with an insulating material that forms a capacitor dielectric for the first capacitor, and wherein the trench is filled with a semiconductor filling material that forms the hole storage area.

11. The sensor according to claim 7, wherein each pixel in the array of pixels is configured to read, at the read node, a first signal representative of a number of the electrons stored at the electron storage area and a second signal representative of a number of the holes stored at the hole storage area.

12. The sensor according to claim 11, wherein each pixel in the array of pixels is further configured to
    combine the first signal and the second signal; and
    form an image from combined first and second signals.

13. The sensor according to claim 11, wherein each pixel in the array of pixels is further configured to reset electrical potentials of the photodiode, the well region, the electron storage area, the hole storage area, and the read node to reference values.

14. A method for obtaining an image using an image sensor, the method comprising:
    generating electron-hole pairs at an array of pixels within the image sensor when photosensitive areas of the array of pixels are illuminated during an illumination; and
    operating the image sensor in a global shutter capture mode by
        storing, at each pixel of the array of pixels in an electron storage area sheltered from light, a first signal representative of the number of electrons generated in the electron-hole pairs during the illumination, storing, at each pixel of the array of pixels in a hole storage area sheltered from light, a second signal representative of the number of holes generated in the electron-hole pairs during the illumination, transferring the first signal from the electron storage area to a read node and reading the first signal, transferring the second signal to the read node and reading the second signal, combining the first signal and the second signal, wherein the first signal and the second signal are coded on a first number of bits, and wherein the first signal and the second signal are combined so as to obtain a combined signal coded on a second number of bits greater than the first number of bits, and forming an image from combined first and second signals.

15. The method according to claim 14, wherein the second signal is transferred into the hole storage area through a first capacitive effect, and the second signal is transferred from the hole storage area to the read node through a second capacitive effect.

16. The method according to claim 15, further comprising capacitively coupling a well region of the pixel to the read node.

17. The method according to claim 15, further comprising capacitively coupling the hole storage area to a reference potential node.

18. The method according to claim 14, further comprising resetting all of the electrical potentials of the pixel to reference values.

* * * * *